United States Patent [19]

Bowman et al.

[11] 4,130,899

[45] Dec. 19, 1978

[54] SYSTEM FOR OPERATING VOLATILE MEMORY IN NORMAL AND STANDBY MODES

[75] Inventors: Rodney V. Bowman; Martin H. Francis, both of Wichita, Kans.

[73] Assignee: NCR Corporation, Dayton, Ohio

[21] Appl. No.: 854,856

[22] Filed: Nov. 25, 1977

[51] Int. Cl.² ............................................. G11C 11/40
[52] U.S. Cl. .................................. 365/222; 365/226; 365/227
[58] Field of Search ............... 365/222, 226, 227, 229; 307/238, 279

[56] References Cited

U.S. PATENT DOCUMENTS

| 4,030,084 | 6/1977 | Fisher | 365/222 |
| 4,050,061 | 9/1077 | Kitagawa | 365/222 |

Primary Examiner—Terrell W. Fears
Attorney, Agent, or Firm—J. T. Cavender; Albert L. Sessler, Jr.; Elmer Wargo

[57] ABSTRACT

A system including first drivers (such as TTL drivers) operatively connected to the control lines of a volatile memory for providing control and refresh functions to the memory in a normal mode, and second drivers (such as CMOS drivers) operatively connected to the control lines for providing refresh functions to the memory in a standby mode. First and second power sources are provided for providing first and second voltage levels to the first and second drivers, respectively. A diode is connected between the first and second power sources to maintain the first and second voltage levels at a predetermined differential from each other in the event that the second power source fails to prevent damage to the second drivers (CMOS) through reverse biasing.

7 Claims, 1 Drawing Figure

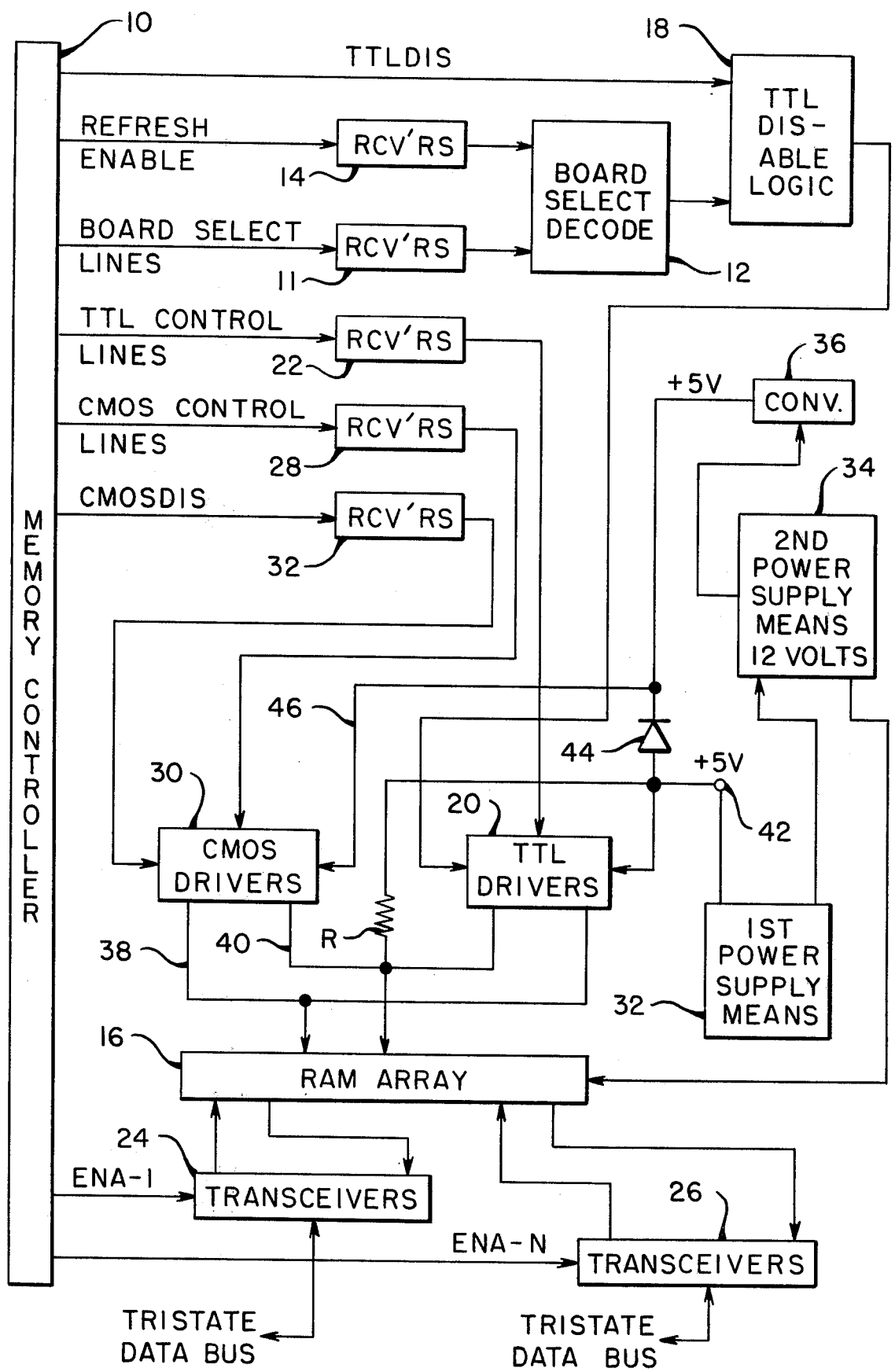

SYSTEM FOR OPERATING VOLATILE MEMORY IN NORMAL AND STANDBY MODES

BACKGROUND OF THE INVENTION

This invention relates to a system for operating a volatile memory in a normal mode and a standby mode, and more particularly, it relates to a system for operating a volatile, dynamic random access memory (RAM) in a normal mode for high speed operation requiring relatively high power and in a standby mode requiring low power consumption.

In general, there does not appear to be any integrated circuit technology available in the prior art which satisfies both the high speed necessary for operating a dynamic random access memory in a normal mode and for operating the memory with low power requirements in a standby mode when the memory is being refreshed from an emergency source of potential such as a battery supported power supply.

SUMMARY OF THE INVENTION

This invention relates to a memory system including a dynamic cell semiconductor memory array having control lines thereto; first drivers operatively connected to the control lines for providing control and refresh functions to the array; second drivers operatively connected to the control lines for providing refresh functions to the array; first and second power supply means for supplying, respectively, first and second voltage levels to the first and second drivers, respectively; and means connecting the first and second power supply means to maintain the first and second voltage levels at a predetermined voltage differential from each other in the event that the second power supply means fails to supply said second voltage to said second drivers.

In a preferred embodiment of this invention, the first drivers are TTL drivers and the second drivers are CMOS drivers. The TTL drivers and the CMOS drivers are wire or'ed together to provide parallel control paths to the memory array and means are included for enabling the TTL drivers and disabling the CMOS drivers when the system operates in a normal mode and for enabling the CMOS drivers and disabling the TTL drivers when the system operates in a standby mode.

Separate power sources are needed to operate the TTL drivers and the CMOS drivers; this is necessary because the first or main power supply means which operates the memory array and the TTL drivers in the normal mode would be shut off or disabled when the system operates in the standby mode. A battery supported supply is utilized for the second power supply means for providing the necessary regulated voltage level to the memory array and a conventional converter is utilized in conjunction with the battery supported supply to provide the necessary voltage level to the CMOS drivers.

One of the problems associated with the CMOS drivers is that they become damaged or destroyed when subjected to a reverse bias in excess of a certain voltage level. Such a situation could occur during normal power-up sequencing of the system when power is supplied to the TTL drivers and for one reason or another, the second power supply means to the CMOS drivers fails. In the embodiment disclosed herein, this problem is obviated by connecting a diode between the first and second power supply means so as to maintain the first and second voltage levels at a predetermined voltage differential from each other.

A second problem associated with providing parallel paths to the memory array with TTL drivers and CMOS drivers is that certain of the control lines to the memory array require the use of pull-up resistors to bring the voltage on the control lines to a necessary level for proper operation of the memory array. Because the pull up resistors are connected to a source of potential, they also can subject the CMOS drivers to a reverse bias which would destroy the CMOS drivers in certain situations, as for example, when power is supplied to the pull up resistors and the second power supply means fails. By a judicious selection of the resistance values for the pull up resistors, this particular problem was obviated.

A feature of this invention is that it provides parallel control paths to the memory array for providing for operation in a normal mode and a standby mode at a low cost.

Another feature of this invention is that CMOS drivers which are used in the standby mode are protected from reverse biasing during normal power-up sequencing of the system and from certain power source failures by simple, low-cost techniques.

These advantages and others will become more readily understood in connection with the following specification, claims, and drawing.

BRIEF DESCRIPTION OF THE DRAWING

The drawing shows a diagram of a preferred embodiment of the invention showing a volatlie memory array, TTL drivers and CMOS drivers, first and second power supply means, a memory controller, and various control logic.

DETAILED DESCRIPTION OF THE INVENTION

The drawing shows a preferred embodiment of this invention, and as previously stated, the memory system shown therein is operated in a normal mode and a standby mode.

When operating in the normal mode, the TTL control lines, the board select lines, the refresh enable lines, and the TTL disable lines (TTLDIS) under the control of a conventional memory controller 10 are used to control the functions of the TTL drivers in a conventional way. The board select lines are handled by conventional receivers 11 whose outputs are fed to conventional board select decode circuitry 12, and similarly, the refresh enable lines are handled by conventional receivers 14 whose outputs are fed to the board select decode circuitry 12 which is conventional combinational logic which is used to select a particular board of the RAM array 16. The output of the board select decode circuitry 12 is fed into conventional TTL disable logic 18 whose output is connected to the TTL drivers 20. The TTL control lines are handled by conventional receivers 22 whose outputs are fed into the TTL drivers 20. The TTL Disable line is fed into the TTL disable logic.

With regard to the board select lines, the refresh enable lines and the TTL disable lines, there is a certain order of priority of operation during normal functioning of the memory system in the normal mode. The board select lines represent the lowest order of priority and are used normally for reading and writing operations associated with a memory board in the RAM array 16. The refresh enable lines represent the next higher priority and will override the board select lines to enable the refresh function to the RAM array when operating the TTL drivers 20 in the normal mode. The TTL disable lines represent the highest priority and will shut off all logic to the TTL drivers 20 so that power to the TTL drivers 20 can be dropped.

The TTL control lines represent the control lines such as all clocks, the various chip select, read/write control lines and address lines. The data into and out of the RAM array 16 is handled by the enable lines (ENA-1 and ENA-N) which handle the selection of a small subset of chips in RAM array 16 via the conventional transceivers 24 and 26. The outputs and inputs to the transceivers 24 and 26 are a conventional tristate data bus.

When the memory system is operated in the standby mode, the CMOS control lines are handled by the conventional receivers 28 whose outputs are fed into conventional CMOS drivers 30. The CMOS control lines include the same control lines as are present for the TTL operation; however, no writing or reading is done in the standby mode, only the refreshing function to the RAM array 16 is performed with CMOS drivers 30 during the standby mode. The CMOS disable line (CMOSDIS) is handled by the conventional receivers 32 whose outputs are fed into the CMOS drivers 30 to disable them whenever the memory system operates in the normal mode. When the CMOS disable line is activated, all the CMOS control lines are blocked out and cannot activate the CMOS drivers 30 which are held in a high impedance state by the disable line. When the CMOS disable line is activated, the memory system operates in the normal mode, and when the TTL disable line is activated, the memory system operates in the standby mode; both disable lines are not deactivated at the same time.

As previously stated, there are first and second power supply means for operating the memory system in the normal operating and standby modes, respectively. The first power supply means 32 is a conventional power source for providing the necessary voltage levels to the TTL drivers 20 and associated circuitry when operating in the normal mode, and the second power supply means 34 includes a battery which is maintained in a fully charged condition by the first power supply means 32 as is conventionally done. The second power supply means 34 supplies the necessary controlled voltage levels to the RAM array 16 during the normal operating mode and the standby mode to provide an uninterruptable source of power to the RAM array 16 as is conventionally done and also supplies the necessary voltage levels to the CMOS drivers 30 and associated circuitry during the standby mode. A conventional converter 36 converts the voltage level of the second power supply means 34 to that required by the CMOS drivers 30.

In the embodiment selected to portray this invention, the RAM array 16 consists of a plurality of 4096 × 1 bit dynamic MOS random access memory chips such as model MK 4096 manufactured by Mostek, the TTL drivers 20 are tri-state quad bus drivers such as model 8T09 manufactured by Signetics, and the CMOS drivers 30 are tri-state hex non-inverting buffers such as model 80C97 manufactured by National Semiconductor. The transceivers 24 and 26 are conventional tristate quad, bus transceivers such as model 8T26 manufactured by Signetics.

The TTL drivers 20 and the CMOS drivers 30 are OR-wired together to provide parallel paths to the RAM array 16. There are two classes of lines, namely Class I and Class II lines, which are wired together in an OR manner. The Class I lines are represented by line 38 in the drawing, and the Class II lines are represented by line 40.

The Class I lines are control lines from the TTL drivers 20 and the CMOS drivers 30 whose outputs are at a sufficiently high voltage level to provide the necessary voltage levels to the RAM array 16 for proper operation thereof. Included in the Class I lines are the chip select lines ($\overline{CS}$) and the address lines ($\overline{A1-A6}$).

The Class II lines are the control lines coming from the TTL drivers 20 whose voltage levels are not at a sufficiently high voltage level to provide the necessary voltage levels to the RAM array 16 for proper operation thereof. Included in the Class II lines are the row select lines ($\overline{RAS}$) and the column select lines ($\overline{CAS}$). Consequently, in order to provide the necessary voltage levels to the RAM array 16 for Class II lines, pull-up resistors are required. These pull-up resistors such as R in the drawing are series connected to the Class II lines and a source of potential such as a +5 volts coming from the first power supply means 32 in the embodiment described.

AS previously stated, there is no integrated circuitry of which applicants are aware which satisfies both the high speed necessary when operating a RAM array in a normal mode and the lower power requirements when operating the RAM array in a standby mode. The TTL drivers 20 were used in the normal mode and the CMOS drivers 30 were used in the standby mode; however, certain problems developed when these TTL drivers 20 and CMOS drivers 30 were wired to provide a parallel path to the RAM array 16.

One of the problems which developed when the parallel paths mentioned were provided was that in certain situations, the CMOS drivers 30 were subjected to a reverse bias which would destroy these drivers. For example, the CMOS drivers 30 are very susceptible to being destroyed by a reverse bias when the voltage on the output exceeds the voltage supply input by a certain value. For the particular CMOS drivers 30 selected to portray this invention, the maximum reverse bias voltage is 0.3 volt. As previously stated, because there are separate power supply means for the normal and standby modes of operation, it is conceivable that the +5 volts from the converter 36 may be accidentally grounded or fail to come up to the necessary +5 volts while the +5 volts from the terminal 42 of the first power supply means 32 is still operational. This problem was obviated by placing a diode 44 between +5 volts from the first power supply means 32 and the +5 volts from the converter 36 in such a way as to never allow the voltage level on the supply input lines 46 to the CMOS drivers 30 to be less than the voltage drop across the diode 44. The diode 44 has its anode connected to the terminal 42 and its cathode connected to the +5 volts from the converter 36; diode 44 is a conventional diode such as IN4002 manufactured by Motorola. The diode 44 also protects the +5 volts to the CMOS drivers 30 from being affected by a dropping of the +5 volts at terminal 42 for the TTL drivers 20. While the voltage drop across diode 44 is typically about 0.7 volts, there is a sufficient voltage drop from the +5 volts from terminal 42 across the TTL drivers 20 at the Class I control lines (38) to the output of the CMOS drivers so that the reverse bias across the CMOS drivers 30 does not exceed the maximum of 0.3 volt when the +5 volt from the converter 36 fails to materialize for one reason or another.

A second problem associated with providing the parallel paths to the RAM array 16 relates to the pull-up resistors R which are on the Class II lines 40 previously described; this problem also occurs when the 30 5 volts from the converter 36 fails to materialize. Initially when the +5 volts from the converter 36 fails to materialize, for example at time $T_o$, there will be a voltage drop of about 0.7 volts across the diode 44; however, there will be no current flowing through the resistors R, except for some small leakage current to the RAM array 16. It would appear initially that with only about 0.7 volt drop across the diode 44, the maximum 0.3 volt limit for reverse biasing across the CMOS drivers 30 would be exceeded for Class II lines 40 as the voltage level at the outputs of the CMOS drivers 30 would be close to 5 volts while the voltage level at the inputs to these drivers would be approximately 4.3 volts. However, if the resistor R is selected to have the proper value, the current through the resistor R, when the +5 volts from the converter 36 fails to materialize, will be limited initially at a time $T_o$ to a value which will not damage the CMOS drivers 30, and when a voltage drop develops across the resistor R, this voltage drop (which is about 0.5 volt) will be sufficient to prevent the CMOS drivers 30 from being reverse biased. In the embodiment described, the value of the resistor R is equal to approximately 2.2K ohms, however, the techniques employed herein can be utilized to provide parallel paths to the RAM array 16 with components which are different from the specific ones selected herein.

Thus, the memory system described herein allows the CMOS and TTL drivers to be operated together without one distorting the operation or shortening the life expectancy of the other. An added feature of the memory system described herein is that it eliminates power sequencing problems as the CMOS drivers are protected regardless of which of the first and second power supply means comes on first.

What is claimed is:

1. A memory system comprising:
   a volatile memory array having control lines thereto;
   first drivers operatively connected to said control lines for providing control and refresh functions to said array;
   second drivers operatively connected to said control lines for providing refresh functions to said array;
   first and second power supply means for supplying, respectively, first and second voltage levels to said first and second drivers, respectively;
   means connecting said first and second power supply means to maintain said first and second voltage levels at a predetermined voltage differential from each other in the event that said second power supply means fails to supply said second voltage to said second drivers.

2. The memory system as claimed in claim 1 in which said first and second drivers are operatively connected to said control lines to said memory array to provide parallel control paths thereto.

3. A memory system operating in a normal mode and a standby mode comprising:
   a dynamic cell semiconductor memory array having control lines thereto;
   TTL drivers having outputs operatively connected to said control lines for providing control and refresh functions to said array during said normal mode;
   CMOS drivers having outputs operatively connected to said control lines for providing refresh functions to said array during said standby mode;
   means for enabling said TTL drivers and disabling said CMOS drivers when said system operates in said normal mode and for enabling said CMOS drivers and disabling said TTL drivers when said system operates in said standby mode;
   first and second power supply means for supplying, respectively, first and second voltage levels to said TTL and CMOS drivers, respectively;
   a diode connected between said first and second power supply means to maintain a voltage level at said second power supply means which is slightly less than said first voltage level when said second power supply means fails to supply said second voltage to said CMOS drivers.

4. The memory system as claimed in claim 3 in which said outputs of said first and second drivers are wire or'ed to said control lines of said memory array to provide parallel control paths thereto.

5. The memory system as claimed in claim 4 in which some of said outputs have insufficient voltage levels to enable said control and refresh functions to be performed, and in which said memory system further comprises a pull-up resistor connected to said first voltage level for each of said outputs at said insufficient voltage level to provide a sufficient voltage level to enable said control and refresh functions, said pull-up resistor having a value which provides a voltage drop thereacross which in conjunction with the voltage drop which appears across said diode prevents said CMOS drivers from becoming reverse biased.

6. A memory system for operating in a normal mode and a standby mode, comprising:
   a dynamic cell semiconductor memory array having control lines thereto;
   TTL drivers having outputs connected to said control lines for providing control and refresh functions to said array during said normal mode;
   CMOS drivers having outputs connected to said control lines for providing refresh functions to said array during said standby mode;
   memory controller means for controlling said TTL drivers and said CMOS drivers;
   said memory controller means including means for enabling said TTL drivers and disabling said CMOS drivers when said system operates in said normal mode and for enabling said CMOS drivers and disabling said TTL drivers when said system operates in said standby mode;
   first and second power supply means for supplying, respectively, first and second voltage levels to said TTL and CMOS drivers, respectively;
   a diode connected between said first and second power supply means to maintain a voltage level at said second power supply means which is slightly less than said first voltage level when said second power supply means fails to supply said second voltage to said CMOS drivers;
   some of said outputs of said TTL drivers having sufficient voltage levels to enable said control and refresh functions to be performed, and
   a pull-up resistor connected to said first voltage level for each of said outputs of said TTL drivers having insufficient voltage levels to provide a sufficient voltage level to enable said control and refresh functions, said pull-up resistor having a value which provides a voltage drop thereacross which is close in value to the voltage drop which appears across said diode.

7. The memory system as claimed in claim 6 in which said array is comprised of intergated circuits such as MK 4096 manufactured by Mostek; said TTL drivers are comprised of integrated circuits such as 8T09 manufactured by Signetics; said CMOS drivers are comprised of integrated circuits such as 80C97 manufactured by National Semiconductor; said diode provides about a 0.7 volt drop thereacross; and said pull-up resistor is equal approximately to 2.2K ohms.

* * * * *

UNITED STATES PATENT OFFICE
CERTIFICATE OF CORRECTION

Patent No. 4,130,899　　　　　　　　　Dated December 19, 1978

Inventor(s) Rodney V. Bowman and Martin H. Francis

It is certified that error appears in the above-identified patent and that said Letters Patent are hereby corrected as shown below:

Column 5, line 8, "30 5" should be --+5--.

Signed and Sealed this

Second Day of October 1979

[SEAL]

Attest:

RUTH C. MASON
Attesting Officer

LUTRELLE F. PARKER
Acting Commissioner of Patents and Trademarks